(12) United States Patent
Bains

(10) Patent No.: US 7,433,992 B2
(45) Date of Patent: Oct. 7, 2008

(54) COMMAND CONTROLLING DIFFERENT OPERATIONS IN DIFFERENT CHIPS

(75) Inventor: Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 352 days.

(21) Appl. No.: 10/992,953

(22) Filed: Nov. 18, 2004

(65) Prior Publication Data
US 2006/0106951 A1 May 18, 2006

(51) Int. Cl.
*G06F 12/00* (2006.01)
*G06F 3/00* (2006.01)
*G06F 13/00* (2006.01)

(52) U.S. Cl. .................. 711/5; 710/5; 710/104
(58) Field of Classification Search ............ 711/5; 710/5, 104
See application file for complete search history.

(56) References Cited

U.S. PATENT DOCUMENTS

| | | | |
|---|---|---|---|
| 6,438,055 B1 | 8/2002 | Taguchi et al. | |
| 6,785,180 B2 | 8/2004 | Cheung | |
| 7,035,154 B2 * | 4/2006 | Takahashi et al. | 365/201 |
| 2003/0021137 A1 | 1/2003 | Johnson et al. | |
| 2003/0126338 A1 | 7/2003 | Dodd et al. | |
| 2003/0142577 A1 | 7/2003 | Kumazaki et al. | |
| 2004/0027898 A1 | 2/2004 | Takahashi et al. | |
| 2004/0098528 A1 | 5/2004 | Janzen | |
| 2004/0179420 A1 * | 9/2004 | Kyung | 365/233 |

OTHER PUBLICATIONS

PCT/US2005/041199 International Search Report and Written Opinion Mailed May 4, 2006.

* cited by examiner

*Primary Examiner*—Reginald G. Bragdon
*Assistant Examiner*—Aracelis Ruiz
(74) *Attorney, Agent, or Firm*—Alan K. Aldous

(57) ABSTRACT

In some embodiments, the invention includes a chip having a register to include an operation type signal. The chip also includes control circuitry to receive a first command and in response to the first command to cause the chip to perform a first operation if the operation type signal has a first value and to cause the chip to perform a second operation if the operation type signal has a second value. The chip may be a memory chip in a memory system. Other embodiments are described and claimed.

19 Claims, 6 Drawing Sheets

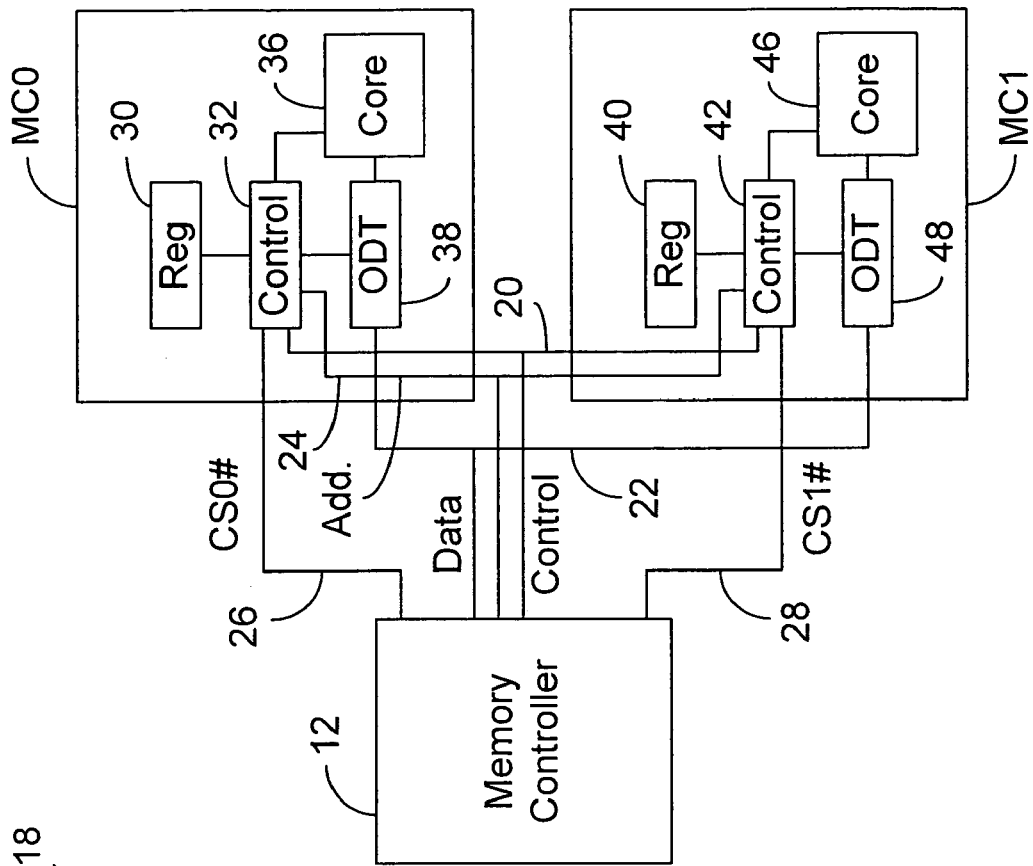
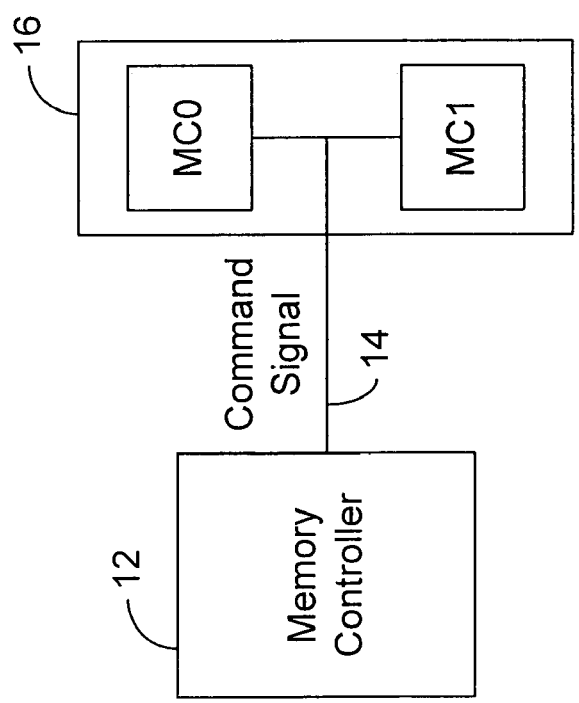
FIG. 1
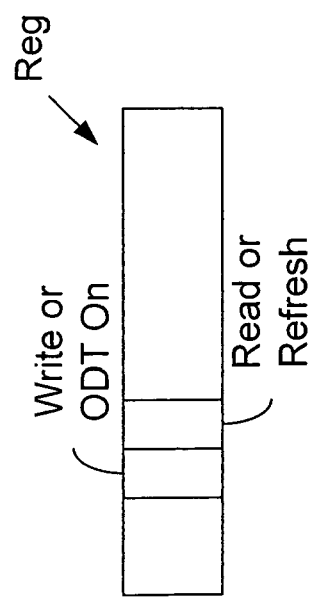
FIG. 3

COMMAND CONTROLLING DIFFERENT OPERATIONS IN DIFFERENT CHIPS

BACKGROUND

1. Technical Field

The present invention relates to semiconductor chips and, more particularly, to chips in which a command causes different operations in different chips.

2. Background Art

Conductors are typically terminated through resistive structures, such as resistive materials and transistors. The terminations have been positioned in various places. Examples of the location of terminations include on motherboards or other circuit boards or cards. Other examples of locations of terminations include on a chip that transmits a signal and/or on a chip that receives a signal. Terminations on the chip are commonly referred to as on die terminations (ODTs).

Some Dynamic Random Access Memories (DRAM) chips have registers referred to as a mode register set (MRS) which includes bits to control functions of the DRAM chips. One or more bits in the MRS may control particular functions of the DRAM chips. Extended MRSs (such as EMRS0, EMRS1 etc.) may provide additional bits for use.

DRAM chips are typically included in memory modules, some of which are dual in-line memory modules (DIMMS). The term rank refers to a group of memory chips that are selected together, for example, through a shared chip select signal or through some other way. Some modules include only one rank per module and some include more than one rank per module. Some ranks include chips on more than one module.

In some two rank memory systems, for best electrical performance, the ODT is enabled on the DRAM chips that are not receiving the data for write operations.

The JEDEC Solid State Technology Association has provided standards for DDR2 (dual date rate 2 or double data rate 2) DRAM chips. In DDR2 DRAM chips, the ODTs are controlled by using discrete signals per rank. In some two rank-1 DIMM systems, two ODT pins are used on the controller and the DIMM. Two pins may also used per DRAM chip to support stacking solutions. As used in this disclosure, the word "pin" means traditional pins or other connections to die pads.

In GDDR3 (graphics DDR3) and also DDR3/DDR2 proposals, the command bus may be shared between two ranks. The DRAM can monitor or snoop the command bus for a write transaction. If it sees a write cycle and no CS# asserted then, it can turn its ODT on. The write command may target the other rank. (CS# are rank or device specific). The term "2N timing" refers to a situation in which it takes an extra clock cycle for sampling as compared to a 1N timing. The sampling may be of a signal, such as an address signal. Snooping may work well for 1N timings, but not for 2N timings (with an additional clock cycle before sampling) because snooping may cause additional clock cycles in turn-around cycles and in leadoff write cycles.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

FIG. 1 is a block diagram representation of a system including a memory controller and a memory module including memory chips according to some embodiments of the invention.

FIG. 2 is a block diagram representation of further details of the memory controller and memory chips of FIG. 1 according to some embodiments of the invention.

FIG. 3 is a representation of a register according to some embodiments of the invention.

DETAILED DESCRIPTION

Figure 4:
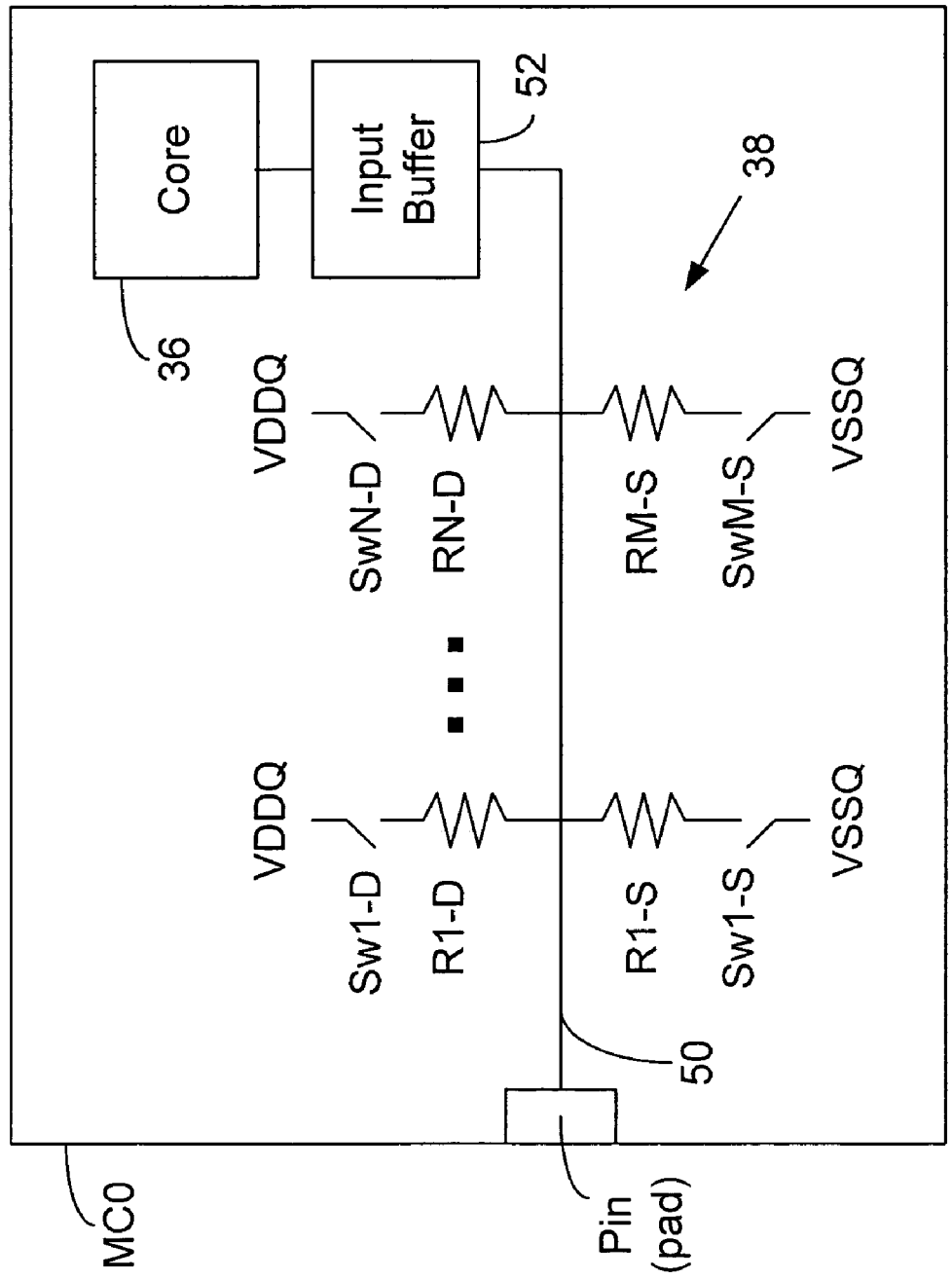
FIG. 4 is a block diagram representation of further details of a memory chip of FIGS. 1 and 2 according to some embodiments of the invention.

Referring to FIG. 1, a memory controller 12 provides various signals including command signals (hereinafter called commands) to a memory chip MC0 and to a memory chip MC1 on a support 16. A memory module 18 includes chips MC0 and MC1 and a support 16 and may include additional chips not illustrated in FIG. 1. Various signals, including commands, pass through interconnects 14 between memory controller 12 and MC0 and MC1. Data, addresses, commands, and chip select signals may be on different conductors or may be shared on at least some of the same conductors. Signals of different types may be carried on different interconnects or the signals may be fully or partially packetized or time multiplexed over the same conductors in interconnects 14.

Chip MC0 responds to a particular command by performing one operation and chip MC1 responds to the same command by performing another operation. For example, chip MC0 may respond to a command, for example, called command A, by performing a write operation while chip MC1 responds to command A by turning on an ODT. Stated another way, chip MC0 may interpret command A as being a write command while chip MC1 interprets command A as being a turn on ODT command. In some embodiments, there is a second command, for example, called command B, for which chip MC0 responds by turning on an ODT while MC1 responds by performing a write operation. As another example, chip MC0 may respond to a command, for example, called command C, by performing a read operation while chip MC1 responds to command C by performing a refresh operation. Likewise, there may be a second command, for example, called command D, for which chip MC0 responds by performing a refresh operation while MC1 responds by performing a read operation. Still other different operations may be performed in response to a command. Note that the labels A, B, C, and D are arbitrary.

There are many ways in which chips MC0 and MC1 may be implemented. FIG. 2 illustrates some example implementations (embodiments), but the invention is not limited to the details of FIG. 2 and the following description of it. The invention may be implemented in various embodiments that are different from FIG. 2 and the description of it. Further, the embodiments of FIG. 2 may include additional components not illustrated in FIG. 2.

Referring to FIG. 2, memory controller 12 is coupled to chips MC0 and MC1 through a control bus 20, a data bus 22, and an address bus 24. Chip select (CS) signals are provided to chips MC0 and MC1 through buses 26 and 28. Chip select signals are sometimes active low and designated CS#. In the case of FIG. 2, the chip select signals are CS0# for chip MC0 and CS1# for chip MC1. Chip select signals are sometimes referred to as device select signals.

The commands referred to in this disclosure may be provided from memory controller 12 to chips MC0 and MC1 through various ways. In some embodiments, the commands described herein are provided only through control bus 20. In other embodiments, the commands are provided through a combination of control bus 20 and address bus 24. In still other embodiments, the data bus is also used to communicate commands. Control circuitry 32 in chip MC0 and control circuitry 42 receive the commands from controller 12, although the signal including the commands may be modified or otherwise changed between the controller 12 and controller circuitry 32 and 42.

Chip MC0 includes a register 30 and chip MC1 includes a register 40. Registers 30 and 40 include operation type signals to control how chips MC0 and MC1 interpret at least some commands. The operation type signals may be in one or more than one bits. As an example, registers 30 and 40 each may be included in a MRS or EMRS using previously unused bits or new bits. However, it is not required that registers 30 and 40 be in an MRS or EMRS.

As an example (called example 1), an operation type signal in register 30 has a first value because, for example, a particular bit in register 30 has a first voltage state. The same operation type signal in register 40 has a second value because the corresponding bit in register 40 has a second voltage state. In example 1, there are commands called commands A and B. Chip MC0 responds to command A as a write command, meaning that control circuitry 32 causes certain data bits on data bus 22 to be stored in core 36 of chip MC0. Chip MC1 responds to command A by turning on ODT 48. More particularly control circuitry 42 turns on ODT 48. Conversely, chip MC0 responds to command B by turning on ODT 38 and chip MC1 responds to command B as a write command. More particularly, in response to command B, control circuitry 32 turns on ODT 38 and control circuitry 42 causes data on bus 22 to be stored in core 46. In some embodiments, if the values of the operation type signals in registers 30 and 40 were reversed, then chip MC0 would respond to command A by turning on ODT 38 and to command B by performing a write operation; and chip MC1 would respond to command A by performing a write operation and to command B by performing an ODT operation.

As another example (called example 2), there are commands called commands C and D. An operation type signal in registers 30 and 40 could be set with particular values such that chip MC0 responds to command C as a read command and to a command D as a refresh command, whilst chip MC1 responds to command C as a refresh command and to command D as a read command. The values of the operation type signal can be set by the states (voltages) of one or more bits in registers 30 and 40. There can be only one or more than one operation type signal in a register. In some embodiments, chips MC0 and MC1 have the features of both examples 1 and 2, whilst in other embodiments, chips MC0 and MC1 have the features of example 1, but not example 2, and in still other embodiments, chips MC0 and MC1 have the features of example 2, but not example 1.

FIG. 3 illustrates a register with one or more bits for "write or ODT on" and one or more bits for "read or refresh." The register of FIG. 3 may represent register 30 or 40, although registers 30 and 40 are not required to include bits for both "write or ODT on" and "read or refresh." In FIG. 3, different bits are shown to control "write or ODT on" and "read or refresh." Alternatively, the same bit(s) can control both. For example, if the operation type signal has a first value, then the chip may respond to command A as a write request and command C as a read request, and if the operation type signal as a second value, the chip responds to command B as an ODT on command and command D as a refresh request. Even other information can be encoded in the operation type signal.

In examples 1 and 2, the first state could be a logical high voltage and the second state a logical low voltage, but that is not required. For example, the first state could be a logical low voltage and the second state could be a logical high voltage. In other embodiments, more than two states (voltages) can be included in a register bit(s).

There are various ways in which an ODT may be constructed and this invention is not limited to any particular way. FIG. 4 illustrates an implementation of ODT 38 in chip MC0, but the invention is not limited to these details. Indeed, various other types of ODT may be used. Further, some embodiments do not include any ODT. Referring to FIG. 4, resistive structures R1-D . . . RN-D are between a data node 50 and switches Sw1-D . . . SwN-D, respectively, which in turn are coupled to a supply voltage node VDDQ. Resistive structures R1-S . . . RM-S are between data node 50 and switches Sw1-S . . . SwM-S, respectively, which in turn are coupled to a ground voltage node VSSQ. The numbers "N" and "M" may be the same or different and may have different values in different implementations. Control circuitry 32 controls the switches and hence whether ODT 38 is "on." The number of switches closed may determine the amount of resistance in the termination. For example, a command A1 may cause one level of resistance in the ODT and a command A2 may cause another level of resistance. In FIG. 4, data node 50 is between a pin (pad) and an input buffer 52. Some chips do not include traditional pins, but may include pads.

Figures 5, 6:
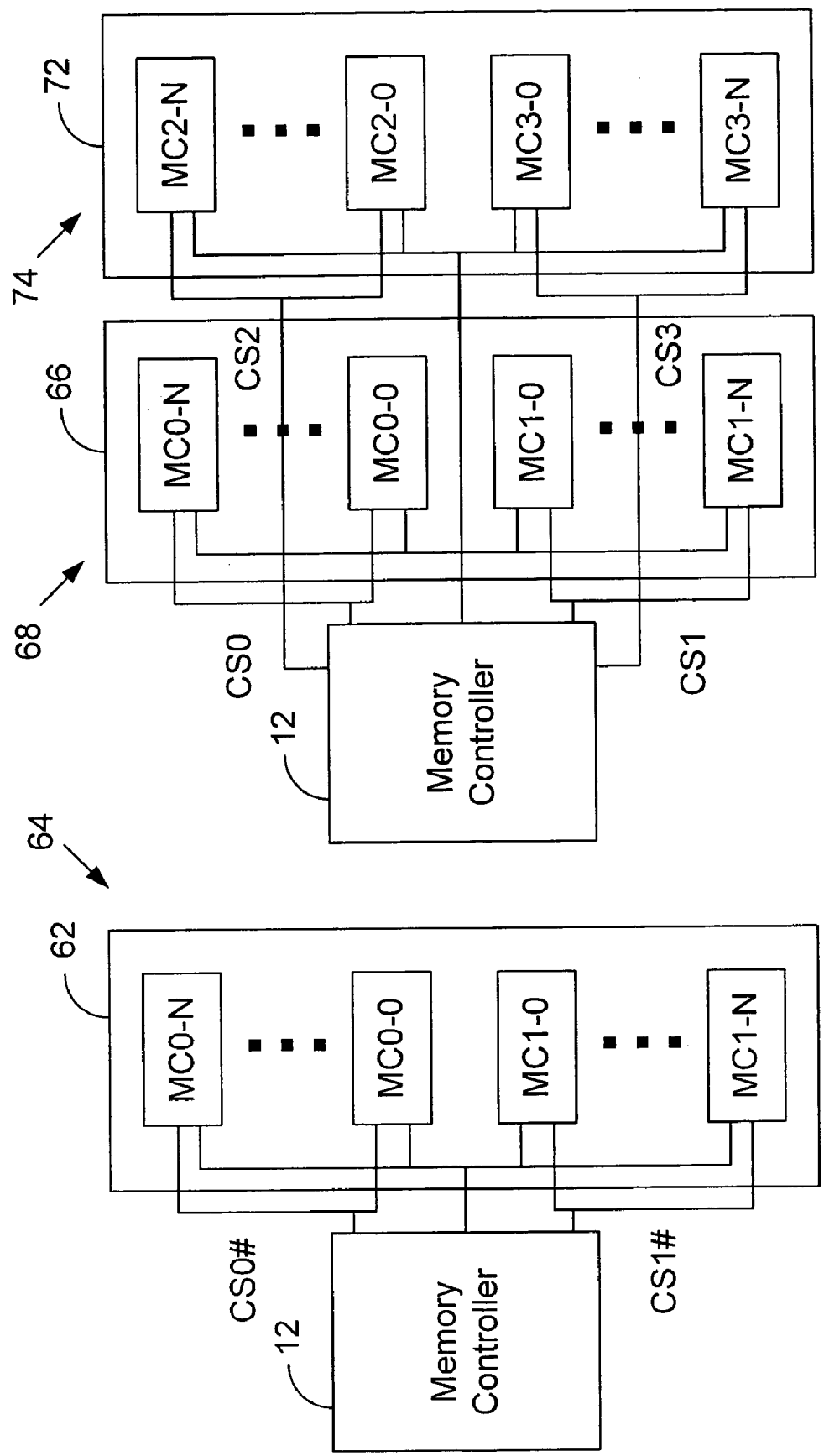
FIG. 5 is a block diagram representation of a system including a memory controller and a memory module according to some embodiments of the invention.
FIG. 6 is a block diagram representation of a system including a memory controller and memory modules according to some embodiments of the invention.

In current typical implementations, more than one memory chip is included in a module. The chips are typically grouped in ranks. For example, FIG. 5 illustrates memory controller 12 being coupled to memory chips in a memory module 64, which has two ranks of chips supported by support 62. A first rank (rank 0) includes memory chips MC0-0 . . . MC0-N (where N is not necessarily the same as in FIG. 4). A second rank (rank 1) includes memory chips MC1-0 . . . MC1-N. The two ranks may have the same number of chips or a different number. FIG. 5 illustrates each chip in a rank being selected by the same chip select signal (CS0 for the chips of rank 0 and CS1 for the chips of rank 1). The chip select signal could be provided on its own multi-drop bus as illustrated in FIG. 5 or through other ways such as a multiplexed or packetized signal.

In FIG. 6, memory controller 12 is coupled to a first memory module 68 with a first rank of chips (MC0-0 . . . MC0-N) and a second rank of chips (MC1-0 . . . MC1-N) supported by a support 66 and to a second memory module 74 with a third rank of chips (MC2-0 . . . MC2-N) and a fourth rank of chips (MC3-0 . . . MC3-N) supported by a support 72.

Chip select signals CS0, CS1, CS2, and CS3 are used to select the chips in the corresponding ranks. Accordingly, chip select signals CS0 is used for all the chips of the first rank (rank 0), CS1 is used for all the chips of the second rank (rank 1) and so forth. The chip select signals in FIG. 6 could include a "#" symbol.

Various alternatives may be used. For example, in some embodiments, each module has only one rank. In this example, FIG. 6 could be modified so that all the chips in module 68 were in one rank and all the chips in module 74 were in another rank. As another alternative, each module could have two ranks, but the system would include only two ranks. In this example, FIG. 6 could be modified so that chips MC0-0 . . . MC0-N and MC2-0 . . . MC2-N would be in one rank and chips MC1-0 . . . MC1-N and MC3-0 . . . MC3-N would be in the other rank. There could be more than two ranks per module and more than four ranks per system.

As illustrated in FIGS. 5 and 6, each of the memory chips are on the same side of supports 62, 66, and 72. In practice, the chips of one rank may be on one side of the support and the chips of another rank may be on the other side of support, or some other arrangement may be used. In some embodiments, chips from the same rank are on different sides of the support.

Figure 7:
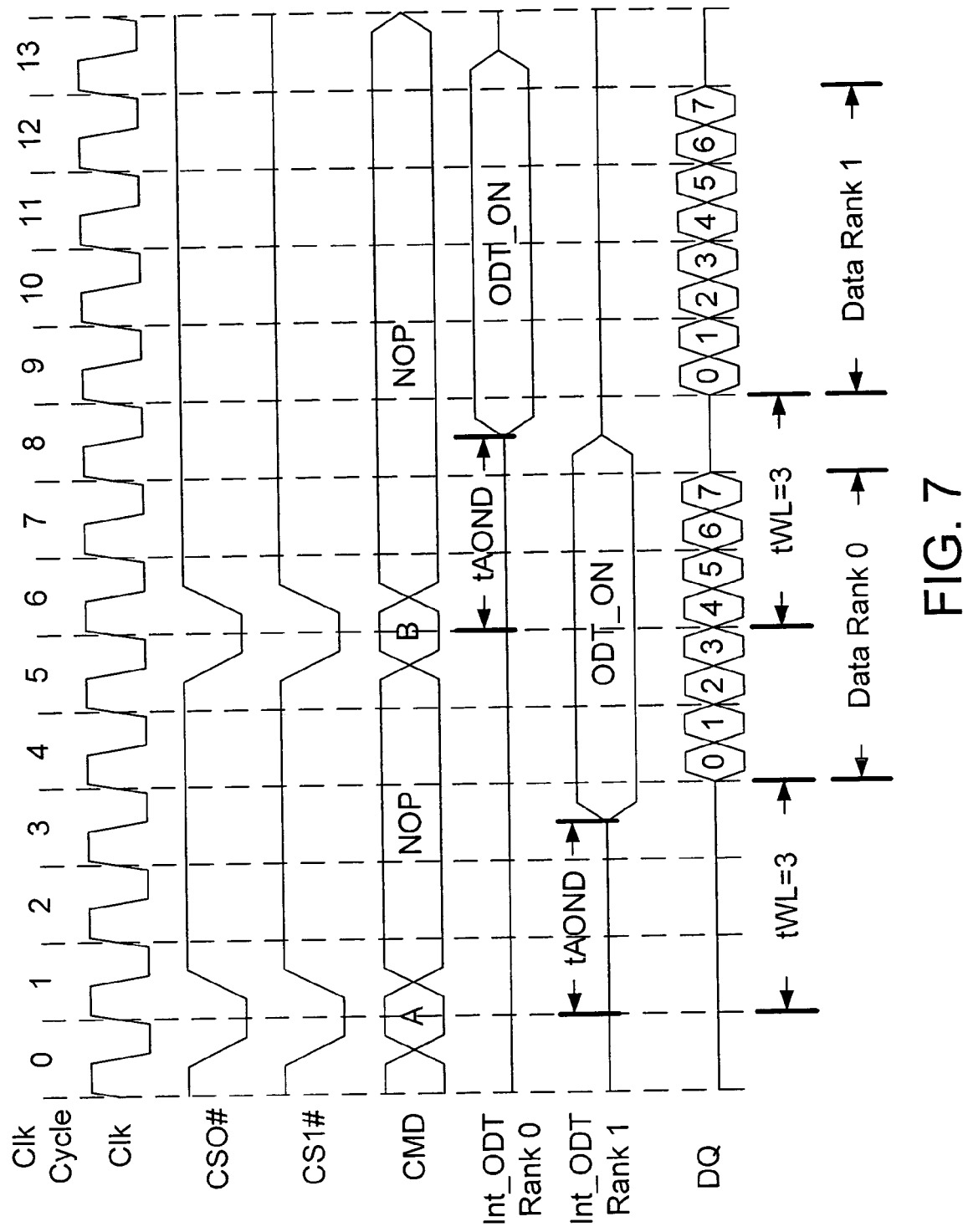
FIG. 7 is a timing diagram illustrating operation of the memory controller and memory chips of FIG. 5 according to some embodiments of the invention.

FIG. 7 provides an illustrative timing diagram for operation of the system of FIG. 5, although the invention is not limited to these details.

During clock cycle 0, command A is issued with CS0# and CS1# asserted.

During clock cycle 3, the ODT in each of chips MC1-0 . . . MC1-N (rank 1) is turned on after a delay of tAOND.

During clock cycles 4-7, data is written to chips MC0-0 . . . MC0-N (rank 0) on the bus after a delay of tWL. As an example, a DDR3 memory chip may be used with a burst length (BL) of 8 and data double pumped (also called dual data rate or double data rate), meaning data is transmitted or received once each half clock cycle. Note that there is some time between the time the ODT is turned on in the chips of rank 1 and the time data is on the bus for the chips of rank 0.

During clock cycle 5, command B is issued with CS0# and CS1# asserted.

During clock cycle 8, the ODT in chips MC1-0 . . . MC1-N (rank 1) are turned off automatically (without a separate command) after a fixed delay based on a burst length of 8. (In some other embodiments, the ODTs are not turned off automatically.) During clock cycle 8, the ODT in chips MC0-0 . . . MC0-N (rank 0) is turned on after a delay tAOND in response to command B.

During clock cycles 9-12, data is written to chips MC1-0 . . . MC1-N (rank 1) on the bus after a delay of tWL.

During clock cycle 13, the ODT in chips MC0-0 . . . MC0-N (rank 0) are turned off automatically after a fixed delay based on a burst length of 8.

In some embodiments, if only one CS# is asserted then the second rank may ignore the command.

Although memory controller 12 is illustrated in different figures, it is not necessary that a memory controller according to the different embodiments of the invention have the ability to operate in each of the different systems.

Figure 9:
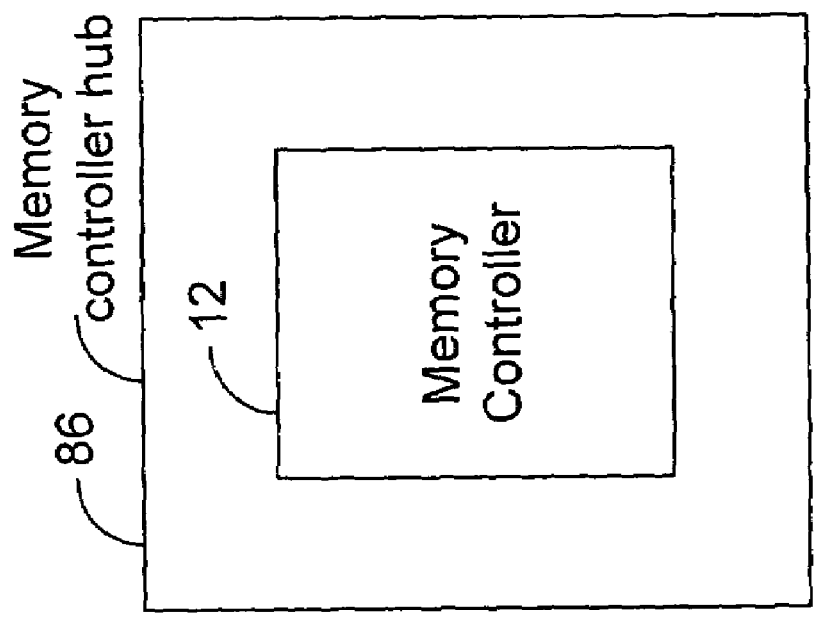
FIG. 9 is a block diagram representation of the memory controller of FIGS. 1, 2, 5, and 6 being included in the same die as a memory controller hub of a chipset.
Figure 8:
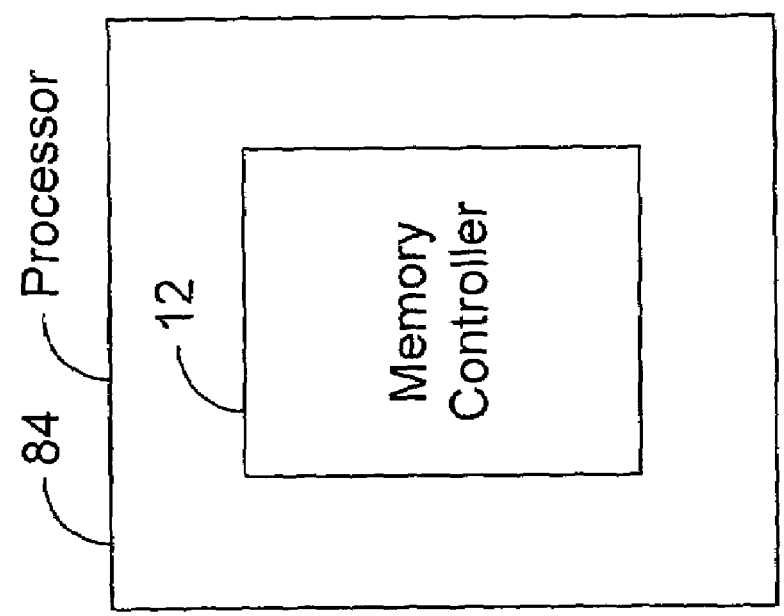
FIG. 8 is a block diagram representation of the memory controller of FIGS. 1, 2, 5, and 6 being included in the same die as a processor.

FIG. 8 illustrates memory controller 12 as being in a processor 84, such as a microprocessor. FIG. 9 illustrates memory controller 12 as being in a memory controller hub 86 in a chipset.

Although FIGS. 2, 5 and 6 are illustrated with multi-drop bus configurations, point to point interconnects may be used. For example, interconnect 14 in FIG. 1 could be multi-drop, point-to-point or a combination of them. A command that is responded to differently by different chips can be received simultaneously by the chips or it can be received a different times by the chips.

Although the memory chips MC0 and MC1 are illustrated, the invention may be used with chips whose primary purpose is not memory storage.

The command may include multiple bits in parallel, in series or in a combination of parallel and series. The command may be packetized with other signals.

The states of the bits in registers 30 and 40 may be set at boot up (turning on the system that includes chips MC0 and MC1) or after boot up. For example, the state might be changed depending on various things that could happen after boot up. In some embodiments (different from those of the example 1), the state of the bits in registers 30 and 40 are changed so that the chips MC0 and MC1 respond to the same command as being sometimes a write command and other times a turn on ODT command. In this case, simply using command A would be sufficient and command B would not be used as it is in example 1.

Figure 10:
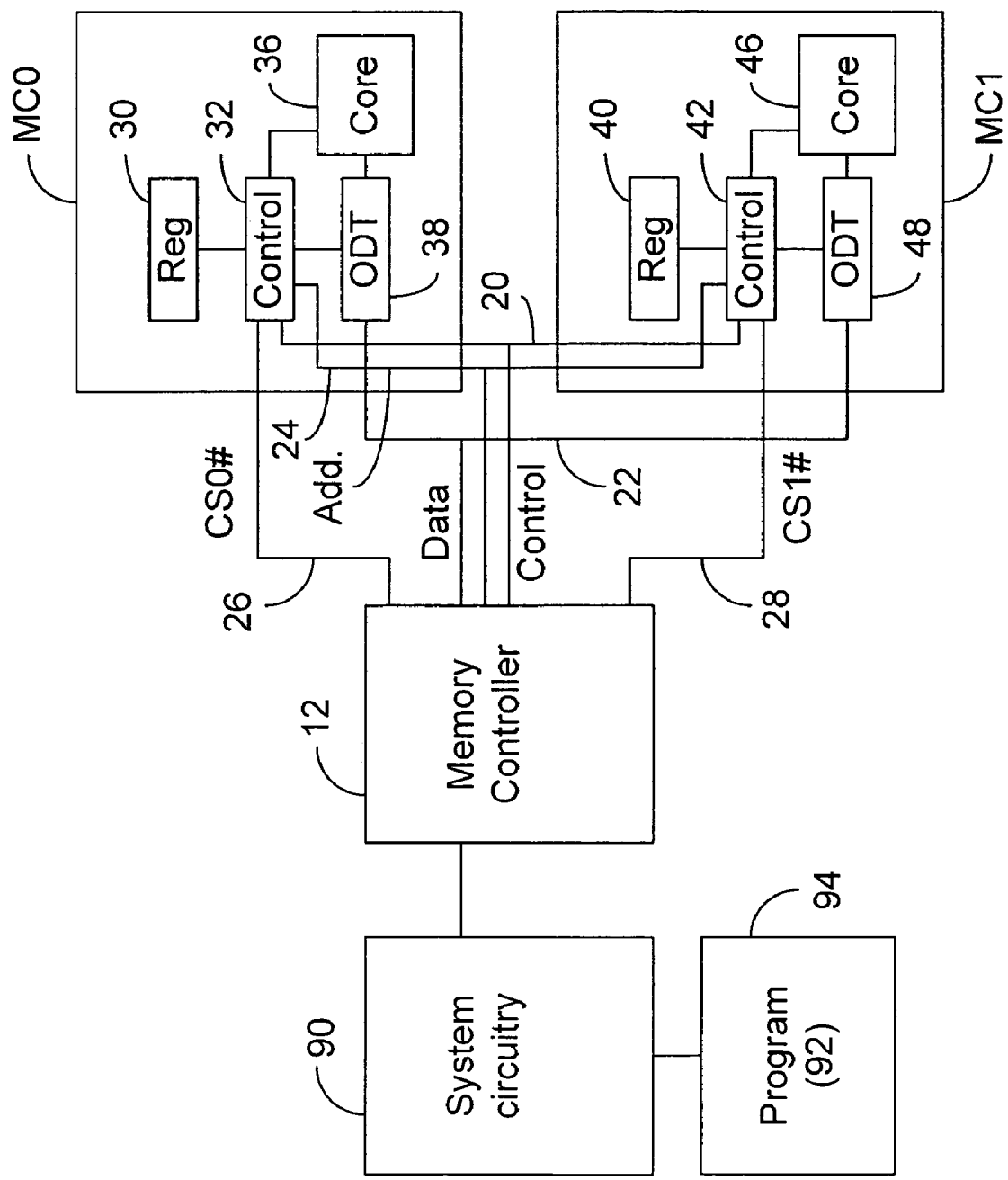
FIG. 10 is a system showing a program to provide values to the registers of FIG. 2.

FIG. 10 is the same as FIG. 2, except that system circuitry 90 interfaces between a program 92 in memory 94. In some embodiments, program 92 may be BIOS, an operating system or other software. Among other things, program 92 may control at least part of the contents of registers 30 and 40 including how chips MC0 and MC1 respond to commands, such as in examples 1 and 2. In other embodiments, program 92 does not control the contents of those parts of registers 30 and 40 that control how chips MC0 and MC1 respond to the commands, such as in examples 1 and 2. For example, memory controller 12 may decide what is to be those contents of registers 30 and 40 based on internal logic of controller 12 independent of control of program 92.

By using a command to control the ODTs, it is not necessary to have a pin (pad) to control the ODTs, although there may be a pin to control the ODTs in some embodiments. In some embodiments, the ODTs are controlled only by commands, not pins. This results in reduction of pins compared to a system with pins used to control the ODTs. In other embodiments, the ODTs are controlled only by pins. In still other embodiments, the ODTs are controlled by commands sometimes and by pins at other times.

By using commands to control ODTs, it does not matter whether a 1N or 2N timing is used. As noted, a 2N timing involves one extra clock cycle to sample a signal.

The term "control" means to at least partially control. The term "cause" means to at least partially cause.

In the disclosure and claims, the use of the word "first" is just for convenience in distinguishing. It does not imply a temporal, spatial, or importance order. For example, reference to a first operational type signal does not mean the first operational type signal is first in a temporal, spatial, or importance order with respect to a second operational type signal. Likewise, reference to a first command does not mean that the first command is first in a temporal, spatial, or importance order with respect to other commands. Similarly, the words "second," "third," and "fourth" are merely labels without implying a temporal, spatial, or importance order.

An embodiment is an implementation or example of the invention. Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

The invention are not restricted to the particular details described herein. Indeed, many other variations of the foregoing description and drawings may be made within the scope of the present invention. Accordingly, it is the following claims including any amendments thereto that define the scope of the invention.

What is claimed is:

1. A chip comprising:
   control circuitry;
   a register to receive an operation type signal and hold the operation type signal for use by the control circuitry; and
   wherein the control circuitry is to receive a first command and in response to the first command to cause the chip to perform a write operation if the operation type signal has a first value and to cause the chip to perform an on-die termination operation if the operation type signal has a second value; and
   wherein the control circuitry is to receive a second command and in response to the second command to cause the chip to perform the on-die termination operation if the operation type signal has a first value and to cause the chip to perform the write operation if the operation type signal has a second value.

2. The chip of claim 1, wherein the operation type signal is a first operation type signal and the register also is to include a second operation type signal and the control circuitry is to receive a third command and to cause the chip to perform a third operation if the second operation type signal has a first value and to cause the chip to perform a fourth operation if the second operation type signal has a second value.

3. A system comprising:
   a first chip to provide a first command and a second command; and
   a second chip including a register to include an operation type signal; and
   a third chip including a register to include an operation type signal, wherein the first and second chips are to receive the first and second commands; and
   wherein if the operation type signal of the second chip has a first value and the operation type signal of the third chip has a second value, then the second chip responds to the first command by performing a write operation and to the second command by performing an on-die termination operation, and the third chip responds to the first command by performing the on-die termination operation and to the second command by performing the write operation; and
   wherein if the operation type signal of the second chip has the second value and the operation type signal of the third chip has the first value, then the second chip responds to the first command by performing the on-die termination operation and to the second command by performing the write operation, and the third chip responds to the first command by performing the write operation and to the second command by the performing on-die termination operation.

4. The system of claim 3, wherein the first chip includes a memory controller, the second chip is in a first rank of memory chips and the third chip is in a second rank of memory chips.

5. The system of claim 3, wherein in response to receiving a third command, the second chip performs a third operation and the third chip performs a fourth operation.

6. The system of claim 3, wherein the command is simultaneously received by the second and third chips.

7. The system of claim 3, wherein the command is received at different times by the second and third chips.

8. A system comprising:
   a memory controller to provide a first command;
   a first group of memory chips each including a register to include an operation type signal; and
   a second group of memory chips each including a register to include an operation type signal, wherein the first and second chips are to receive the first and second commands; and
   wherein if the operation type signal of the first group of memory chips has a first value and the operation type signal of the second group of memory chips has a second value, then the first group of memory chips responds to the first command by performing a write operation and to the second command by performing an on-die termination operation, and the second group of memory chips responds to the first command by performing the on-die termination operation and to the second command by performing the write operation; and
   wherein if the operation type signal of the first group of memory chips has the second value and the operation type signal of the second group of memory chips has the first value, then the first group of memory chips responds to the first command by performing the on-die termination operation and to the second command by performing the write operation, and the second group of memory chips responds to the first command by performing the write operation and to the second command by the on-die termination operation.

9. The system of claim 8, wherein the first operation is a write operation and the second operation is to turn on an on die termination in the chip performing the operation.

10. The system of claim 8, wherein the first operation is to turn on an on die termination in the chip performing the first operation and the second operation is a write operation.

11. The system of claim 8, wherein the first operation is a read operation and the second operation is a refresh operation.

12. The system of claim 8, wherein the first operation is a refresh operation and the second operation is a read operation.

13. The system of claim 8, wherein the first group of memory chips is in a first rank and the second group of memory chips is in a second rank.

14. The system of claim 8, further including system circuitry to interface between a program and the memory controller to control the state of the at least one bit in the chips.

15. The system of claim 14, wherein the program includes BIOS.

16. The system of claim 14, wherein the program includes an operating system.

17. The system of claim 8, wherein the memory controller provides signals to the memory chips of the first and second groups to set the operation type signals in the registers.

18. The system of claim 17, wherein a value of the operation type signal is set when the memory chips become operational.

19. The system of claim 17, wherein a value of the operation type signal may change after the memory chips become operational.

* * * * *